United States Patent [19]

Kusano et al.

[11] Patent Number: 5,225,659

[45] Date of Patent: Jul. 6, 1993

[54] METHOD AND APPARATUS FOR SURFACE TREATING AN AXIALLY SYMMETRIC SUBSTRATE AT ATMOSPHERE PRESSURE

[75] Inventors: Yukihiro Kusano, Tokorozawa; Masato Yoshikawa, Kodaira; Kazuo Naito, Kawasaki; Satiko Okazaki, 20-11, Takaidohigashi 2-chome, Suginami-ku, Tokyo; Masuhiro Kogoma, 843-15, Shimoniikura, Wakou-shi, Saitama-ken, all of Japan

[73] Assignees: Bridgestone Corporation; Satiko Okazaki, both of Tokyo; Masuhiro Kogoma, Wakou, all of Japan

[21] Appl. No.: 866,423

[22] Filed: Apr. 10, 1992

[30] Foreign Application Priority Data

Apr. 12, 1991 [JP] Japan ................. 3-108470

[51] Int. Cl.$^5$ .............................. B23K 9/00
[52] U.S. Cl. ............ 249/121.59; 219/121.52; 219/121.4; 219/121.48
[58] Field of Search ........... 219/121.48, 121.39, 219/121.4, 121.43, 121.59, 121.52, 121.36

[56] References Cited

U.S. PATENT DOCUMENTS

| 4,430,547 | 2/1984 | Yoneda et al. ............... 219/121.43 |
| 4,803,332 | 2/1989 | Koyama et al. ............. 219/121.43 |
| 4,877,938 | 10/1989 | Rau et al. ..................... 219/121.59 |
| 5,099,100 | 3/1992 | Bersin et al. ................. 219/121.43 |

FOREIGN PATENT DOCUMENTS

| 0006275 | 1/1980 | European Pat. Off. . |
| 0346055 | 12/1989 | European Pat. Off. . |
| 0431951 | 6/1991 | European Pat. Off. . |
| 1-306569 | 12/1989 | Japan . |
| 2-15171 | 1/1990 | Japan . |

OTHER PUBLICATIONS

Patent Abstracts of Japan, vol. 11, No. 398 (C-466) (2345), Dec. 25, 1987, & JP-A-62-158-885, Jul. 14, 1987, A. Iwasaki, et al., "Gas Etching Method".

7th International Conference Ion & Plasma Assisted Techniques (Proceedings), May, 1989, pp. 70-73, K. J. A. Mawella, et al., "The Effect of Co-Deposition of Metals on the Microstructure and Properties of Sputtered Alloy Coatings".

Primary Examiner—Mark H. Paschall
Attorney, Agent, or Firm—Oblon, Spivak, McClelland, Maier & Neustadt

[57] ABSTRACT

A surface treating apparatus which comprises a hollow cylindrical electrode and a counter electrode provided within the hollow cylindrical electrode, and a power supply for applying a potential between the electrode and the counter electrode to cause an atmospheric pressure plasma in the presence of a selected gas to generate within the cylindrical electrode is described. A method is also described, wherein a material to be treated is placed between the electrodes and a potential is applied therebetween to generate the plasma to effect the surface treatment of the material. The method and apparatus are very effective for surface treatment of axially symmetric substrates in the form of bars, tubes or fibers.

6 Claims, 3 Drawing Sheets

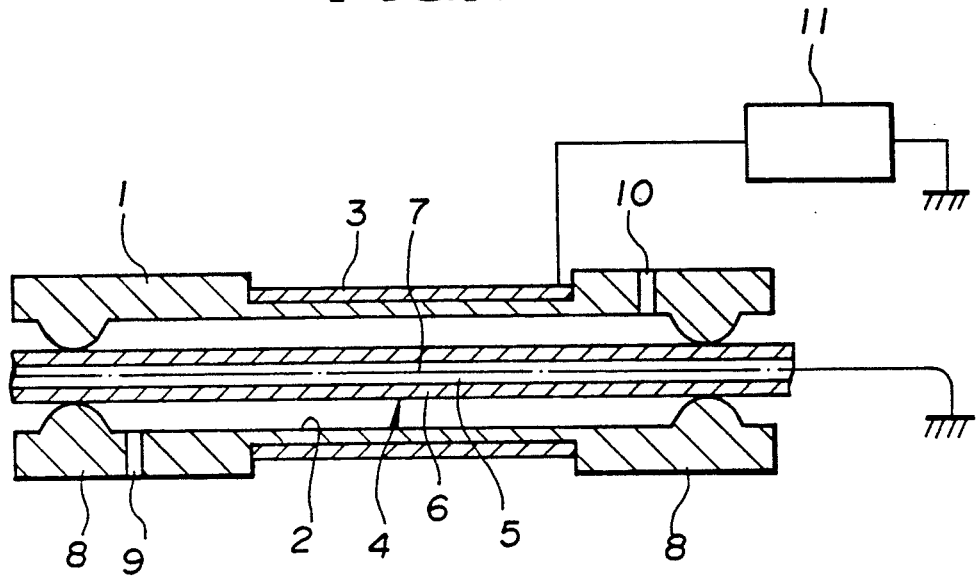
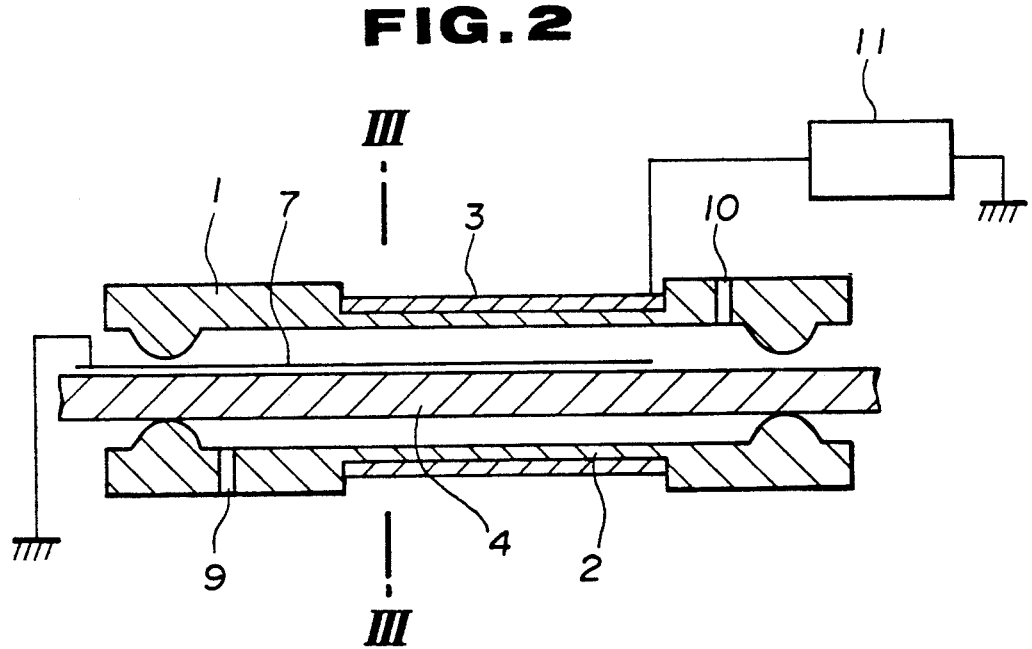

METHOD AND APPARATUS FOR SURFACE TREATING AN AXIALLY SYMMETRIC SUBSTRATE AT ATMOSPHERE PRESSURE

BACKGROUND OF THE INVENTION

1. Field of the Invention

This invention relates to a surface treating method and apparatus wherein the surface of substrates with an axially symmetric shape such as bars, tubes or fibers can be treated by an atmospheric pressure plasma technique uniformly and efficiently.

2. Description of the Prior Art

Several surface treating or surface property-improved methods are known in the art wherein substrate surfaces are treated to impart hydrophilic or water-repellent properties thereto. Among them, treatment by discharge techniques such as corona discharge treatments, low pressure glow plasma treatments and the like are important as a dry and clean treating method.

The corona discharge treatment is effected at an atmospheric pressure in an atmosphere of air or nitrogen and is the most inexpensive and simplest treating technique among discharge treatments. However, since electrons are discharged in the form of a beam for the corona discharge, the treated surface is liable to become uneven. In addition, the gas temperature tend to be significantly higher than a gas temperature in a low temperature plasma, thus presenting the problem that the surface treatment other than a hydrophilic treatment is very difficult. The degree of hydrophilicity attained by the corona discharge treatment is usually poorer than in the case of plasma treatments.

On the other hand, according to the low pressure glow plasma treatment, it is possible to effect a uniform surface treatment with a reduced degree of unevenness, with the further possibility that a variety of highly functional surfaces are obtained by treatments wherein the type of atmospheric gas, input electric power, frequency and pressure are appropriately controlled. However, since the low pressure plasma treatment is generally performed at a pressure as low as not higher than 10 Torr., a large-scale vacuum apparatus is necessary for carrying out the treatment on an industrial scale, resulting in an increase of equipment costs and treating costs. In addition, if a material to be treated contains moisture or gaseous plasticizers in large amounts, these are vaporized under reduced pressure conditions and are caused to be discharged from the surface of the material to be treated. This may result in properties and functions which are not intended for the plasma treatment. Moreover, such a plasma treatment as set out above is liable to generate heat during the course of the treatment, with an attendant problem that a material to be treated which is made of low melting materials is difficult to treat.

Another surface treating technique which solve the problems of both types of treating techniques has been proposed, in which a stable glow plasma is obtained at an atmospheric pressure and is used to treat the surface of a substrate (Japanese Laid-Open Patent Application Nos. 1-306569 and 2-15171).

The surface treatment by the atmospheric pressure plasma technique is carried out at a pressure close to an atmospheric pressure, so that a large-scale vacuum apparatus is not necessary and this technique is appropriately applicable to substrates which contain large amounts of moisture or gas-emitting plasticizers. In addition, little heat is generated at the time of the treatment. Accordingly, this treatment is applicable to low melting substrates and also to a local portion, i.e. only a predetermined portion of a substrate may be treated.

The atmospheric pressure plasma treating apparatus set forth in the above-indicated applications makes use of parallel flat plate electrodes or similarly shaped electrodes. Attempts have been made to the shape of the electrode surface in order to obtain a uniform discharge at an atmospheric pressure. However, our investigations reveal that the surface of an axially symmetric substrate such as bars, tubes or fibers are difficult to be uniformly, efficiently treated according to the methods of the applications.

SUMMARY OF THE INVENTION

It is accordingly an object of the invention to provide a surface treating method of an axially symmetric substrate such as a bar, tube or fiber by an atmospheric glow plasma technique whereby the surface of the substrate can be uniformly treated without involving unevenness by the treatment.

It is another object of the invention to provide a surface treating apparatus for carrying out the surface treating method mentioned above.

We made intensive studies in order to achieve the above objects and, as a result, found that an axially symmetric substrate such as a bar, tube or fiber can be surface treated uniformly and efficiently by a procedure which comprises providing a cylindrical electrode having a counter electrode placed therein, preferably the counter electrode being provided along the axial direction of the cylindrical electrode, and applying a potential between the electrodes to generate an atmospheric pressure plasma in the inside of the cylindrical electrode, under which the substrate is placed in a zone of forming the atmospheric pressure plasma in the inside of the cylindrical electrode. This procedure is very effective to continuous surface treatment of an elongated substrate to be treated.

According to one embodiment of the present invention, there is provided a surface treating method which comprises applying a potential between electrodes spaced apart from each other in the presence of a selected gas at an atmospheric pressure thereby generating a plasma, and exposing a material to be treated to the thus generated plasma, the method characterized in that one of the electrodes is in the form of a hollow cylinder within which another electrode is placed in a spaced relation with respect to the one electrode so that the atmospheric plasma is generated in the inside of the one electrode in the form of the hollow cylinder, and the material to be treated is placed in a zone where the plasma has been generated.

According to another embodiment of the invention, there is provided a surface treating apparatus of the type wherein a potential is applied between electrodes spaced apart from each other in the presence of a selected gas at an atmospheric pressure thereby generating a plasma, and exposing a material to be treated to the thus generated plasma, which apparatus comprising an electrode in the form of a hollow cylinder, a counter electrode placed in the inside of the hollow cylinder in a spaced relation with respect to the cylindrical electrode and a power supply for applying a potential between the cylindrical electrode and the counter electrode to generate an atmosphere plasma, whereby a material to be treated which is placed between the cylindrical electrode and the counter electrode is surface treated with the atmospheric plasma.

BRIEF DESCRIPTION OF THE DRAWINGS

FIG. 1 is a schematic sectional view of a surface treating apparatus according to one embodiment of the invention;

FIG. 2 is a schematic sectional view of a surface treating apparatus according to another embodiment of the invention;

DETAILED DESCRIPTION AND EMBODIMENTS OF THE INVENTION

Figure 3:
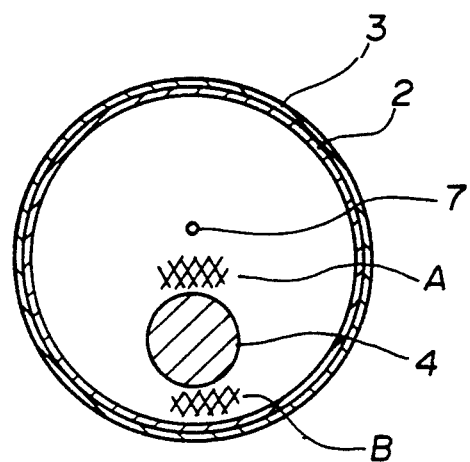
FIG. 3 is a section taken along the line III—III of FIG. 2.

In the surface treating method of the invention, a plasma is generated by application of a potential between an electrode in the form of a hollow cylinder and a counter electrode placed in the hollow cylinder in the presence of an intended gas at an atmospheric pressure and a material to be treated is treated on the surface thereof with the thus generated plasma.

The intended or selected gases for the plasma generation should be properly selected on the type of surface treatment and may be all gases which are ordinarily used for atmospheric pressure plasma treatments, low pressure plasma treatments and the like. Specific and typical examples include inert gases, $N_2$, $O_2$, $H_2O$, air, $CO_2$, halogen compound gases such as fron gases, halon gases, $NF_3$ and $SF_6$, organic compound gases, $NH_3$, $NO_x$, $SO_x$, silanes, etc.

In order to stably obtain an atmospheric plasma, the above-stated gases should preferably be diluted with gases which are liable to suffer atmospheric glow discharge, e.g. inert gases. Examples of the diluent gases include inert gases such as helium, neon, argon, nitrogen and the like, other gases such as oxygen, hydrogen, organic gases and the like. These gases may be used singly or in combination. Of these, helium, neon and the like inert gas are preferred.

In the treating method of the invention, a material to be treated is placed in a zone at which the atmospheric pressure plasma discharge takes place and the gas or gases are fed to the discharge zone. A source for the gas is not always fed in the form of a gas at normal temperatures and how to feed the gas or gas source depends on the temperature in the treating zone and the type of gas source, whichever solid, liquid or gas, at normal temperatures. More particularly, when the gas source is fed in the form of a gas at the temperature in the treating zone or at normal temperatures, it may be fed into the treating zone as it is. When a liquid which has a relatively high vapor pressure is used, the vapor may be passed into the zone. Alternatively, the liquid may be bubbled with a gas such as an inert gas and passed into the zone. On the other hand, where the source is not gaseous and is low in vapor pressure, it may be heated to generate a gas or to cause it to be high in vapor pressure and then fed to the zone.

In this manner, a material to be treated is surface treated in the presence of an atmosphere of such a gas as set forth above according to the atmospheric plasma technique. In this treatment, one of the electrodes is in the form of a hollow cylinder and a counter electrode is placed in the hollow cylinder in a spaced relation. When an appropriate potential is applied between the electrodes, an atmospheric plasma zone is formed in the cylindrical electrode wherein the material to be treated is treated on the surface thereof.

The method of generating the atmospheric pressure plasma used in the present invention may be any method wherein discharge takes place at an approximately atmospheric pressure within a cylinder-shaped electrode. The potential may be broadly applied by two types using a DC current and an AC current, respectively. Industrially, it is easy to use AC discharge. In either case, at least a pair of electrodes provided at a side where the potential is applied and at another ground side have to be used. In the practice of the invention, when a high voltage may be applied to the either side electrode, it is, in most cases, advantageous to use a counter electrode for the cylindrical electrode as a ground side electrode in view of the ease in handling.

With the AC discharge, when one or both of the electrodes used to form the atmospheric glow plasma are covered with an insulator, a stable atmospheric glow plasma can be readily obtained. Thus, it is preferred to cover the electrode or electrodes with an insulator. In this connection, however, with the DC discharge, because a DC glow is formed and stabilized by direct passage of electrons from the electrode, it is recommended not to cover both electrodes at the high voltage applied side and the ground side with an insulator.

Where the cylindrical electrode is covered with an insulator for use in the AC discharge, there are known the following two typical covering techniques. In one technique, a metallic electrode in the form of a hollow cylinder may be coated or covered on the inner surface of the cylinder with a thin layer of an insulator with a thickness of from 0.01 $\mu$m to 10 mm, or may be attached with a film of an insulator such as polyesters, polyimides, fluorine-containing resins, mica, glass or the like. In another technique, a hollow cylinder made of an insulator, such as a Pyrex glass tube, with a thickness of from 0.1 to 5 mm is covered on the outer surface thereof with a metal used as an electrode.

In the AC discharge, the drop of the voltage owing to the formation of the insulator does not contribute to the discharge zone, so that it is usually preferred to make the voltage drop through the insulator as small as possible. Accordingly, it is preferred that in a low frequency discharge where the voltage drop becomes pronounced when the thickness of the insulator increases, the thickness of the insulator is thin. On the other hand, in a high frequency discharge, all the techniques can be favorably employed.

The cylindrical electrode may take various forms of a hollow cylinder, a hollow polygon, a hollow ellipsoid and the like. In order to obtain a uniform glow discharge, the hollow cylinder is most preferred. On the other hand, the counter electrode for the cylindrical electrode is not limitative with respect to its shape. Preferably, bars, tubes and the like are used. The counter electrode is provided along the axial direction of the cylindrical electrode, preferably along the axis of the hollow cylinder. As a matter of course, the counter electrode is formed of conductive materials such as metals. If a material to be treated is in the form of a bar, tube or fiber which is axially symmetric in shape and part or all of the material to be treated is electrically conductive, the material to be treated may be use as a counter electrode for the cylindrical electrode.

Where the surface treatment by the atmospheric pressure plasma process is performed according to the invention, the cylindrical electrodes may be used as provided in the respective treating chambers. In some case, the cylindrical electrode may be used as a part of walls of the treating chamber. In the latter case, the atmospheric gas may be very effectively supplied to the discharge zone, so that the feed of the atmospheric gas can be reduced, thus being good in economy.

In the practice of the invention, the material to be treated to which the present invention is applied may take any form, for example, of a sphere, a block, a sheet or the like, provided that it can be placed in position of the discharge zone. In view of the arrangement of the apparatus of the invention, it is most preferred that the material has an axial symmetric form such as of a bar, a tube, a fiber or the like. In addition, the continuous treatment of elongated materials is very easy.

Apparatus of the invention for carrying out the surface treatment by the atmospheric plasma process are described with reference to FIGS. 1 to 3. In FIG. 1, there is shown an embodiment using a material to be treated as a counter electrode for a cylindrical electrode. In the figure, there is shown a cylindrical apparatus body 1 which is made of an insulating material. The body 1 is fixedly attached with a cylindrical metal electrode 3 on an outer central portion of the body 1. The cylindrical electrode 3 is insulated with an insulator 2 of the body 1 on the inner surface thereof. A material 4 to be treated is made of a conductive cylinder core 5 and a substrate 6 to be treated which covers the core 5 on the outer surface thereof. The material 4 is provided along the axis of the body 1. In this embodiment, the core 5 serves as a counter electrode 7. The material 4 to be treated in held in position by means of support rings 8, 8 integrally, axially projected from the inner peripheral portions at opposite sides of the body 1. In addition, the body 1 has a gas feed port 9 and a gas exhaust port 10 at one and other ends of the body 1, respectively, which are provided at inner sides of the rings 8, 8, respectively.

In the above embodiment, the material 4 to be treated is used as the counter electrode, so that the apparatus is simplified and an atmospheric plasma zone is reliably established between the cylindrical electrode 3 and the counter electrode 7 and is uniformly formed around the material 4 to be treated. Thus, the material 4 to be treated can be uniformly treated on the surface thereof.

FIG. 2 shows another embodiment of the invention. In this embodiment, the material 4 to be treated is not used as the counter electrode and a separate wire-shaped counter electrode 7 is provided. Other arrangement is similar to that of FIG. 1. In the apparatus of FIG. 2, when the material 4 to be treated has a diameter far larger than the counter electrode 7, as shown in FIG. 3, there are produced shaded portions A, B of the material to be treated. The glow plasma is appropriately generated at such shaded portions A, B, ensuring a good surface treatment.

The present invention is more particularly described by way of examples, which should not be construed as limiting the invention. Comparative examples are also described.

EXAMPLE 1

Using the apparatus shown in FIG. 1, the surface treatment by the atmospheric pressure plasma process was effected in the following manner. A hollow cylindrical electrode 3 which was made of copper and had an inner diameter of 25 mm and a length of 400 mm. The cylindrical electrode 3 is covered with an insulator layer 2 on the inner surface thereof in a thickness of about 300 $\mu$m. A material 4 to be treated was a round bar having an iron core 5 coated with an ethylene/tetrafluoroethylene copolymer (ETFE) with a diameter of 6 mm.

In this example, the material 4 to be treated was placed so that the iron core 5 was in coincidence with the axis of the cylindrical electrode 4. The iron core 5 was grounded. While helium gas was fed from a gas feed port 9 into the body at a rate of 1.0 liter/minute, an AC voltage was applied from an AC power source to the cylindrical electrode 3, so that the material to be treated was hydrophilically treated on the surface thereof. The treating conditions for the material surface are indicated in Table 1.

Comparative Examples 1 and 2

Figure 5:
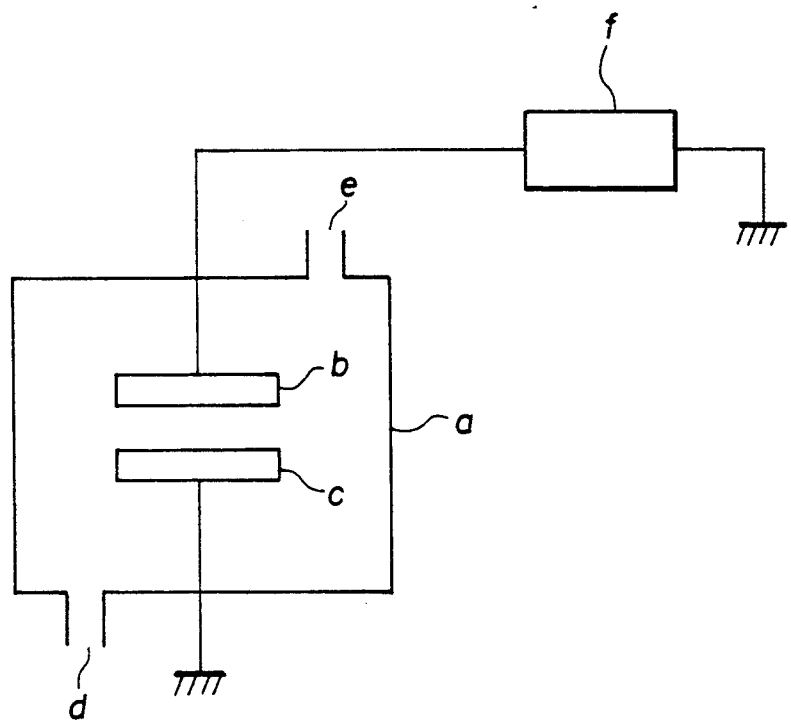
FIG. 5 is a schematic view of a known surface treating apparatus.

For comparison, a parallel plate electrode-type surface treating apparatus shown in FIG. 5 was used for the surface treatment. In FIG. 5, indicated at a is a treating chamber, at b, c are plate-shaped electrodes which are provided within the treating chamber and are in face-to-face relation with each other at a given distance, at d is a gas feed port, at e is a gas exhaust port, and at f is an AC power source. The electrodes b, c are both covered with an insulator and the distance therebetween is 15 mm.

An 50 $\mu$m thick ETFE film (Comparative Example 1) and a cylindrical material similar to that used in Example 1 (Comparative Example 2) were provided as a material to be surface treated. Each sample was placed between the electrodes b, c, followed by formation of an atmospheric pressure plasma zone to effect the hydrophilic treatment as in Example 1. The treating conditions are shown in Table 1 below.

TABLE 1

|  | Example 1 | Comparative Examples 1 and 2 |
|---|---|---|
| Atmospheric Gas | He | He |
| Flow rate (liter/minute) | 1.0 | 3.0 |
| Frequency (kHz) | 9 | 9 |
| Applied Voltage (kV) | 3.0 | 3.0* |
| Treating Time (Seconds) | 60 | 60 |

The treated materials obtained in Example 1 and Comparative Example 1 were each subjected to measurement through ESCA to determine the surface composition thereof. The surface compositions of the treated materials are shown in Table 2 along with the surface composition of a non-treated material.

TABLE 2

|  | Surface Composition (atomic percent) | | | |
|---|---|---|---|---|
|  | C | F | O | N |
| Example 1 | 73 | 10 | 16 | 1 |

TABLE 2-continued

| | Surface Composition (atomic percent) | | | |
|---|---|---|---|---|
| | C | F | O | N |
| Comparative Example 1 | 68 | 24 | 7 | 1 |
| Non-treated Material | 44 | 55 | 1 | 0 |

The results of Table 2 reveal that in Comparative Example 1, the fluorine is partially removed and oxygen and nitrogen are added, so that the surface of the treated material is rendered hydrophilic to an extent. With the treated material of Example 1, the rate of the removal of the fluorine and the rate of the addition of oxygen are both higher than those in Comparative Example 1, thus causing a greater change in the composition to occur. Thus, it will be seen that the surface treatment according to the invention is very effective.

Figure 4:
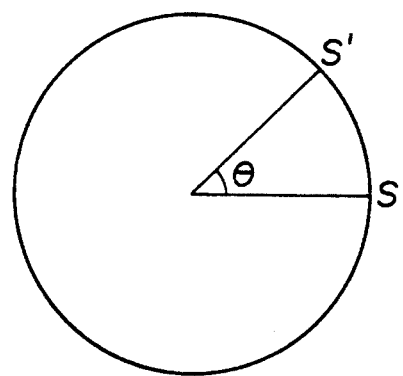
FIG. 4 is an illustrative view showing a measuring position of a contact angle of a water drop with surface treated materials obtained in example and comparative example 2.

The treated materials obtained in Example 1 and Comparative Example 2 were each subjected to measurement of a contact angle of water droplet with the material surface to determine a degree of the surface treatment along the periphery theory. In FIG. 4, there is shown a section of the treated material of the cylindrical form wherein an angle, $\theta$, for indicating the measuring position is defined. More particularly, the contact angle of a water droplet was measured by dropping a droplet at surface portions, S′, kept away at every 45° from a reference surface, S, at which $\theta = 0$. A smaller contact angle of the droplet indicates a higher degree of the hydrophilic treatment of the treated surface. The results of the measured of the contact angle are shown in Table 3.

TABLE 3

| $\theta$ (degree) | 0 | 45 | 90 | 135 | 180 | 225 | 270 | 315 |
|---|---|---|---|---|---|---|---|---|
| Example 1 | 46 | 42 | 44 | 43 | 45 | 45 | 46 | 44 |
| Comparative Example 2 | 49 | 58 | 59 | 50 | 48 | 60 | 47 | 52 |
| Non-treated material | 94 | 91 | 92 | 93 | 92 | 94 | 92 | 93 |

The results of Table 3 reveal that the treated material of Example 1 is better and more uniform that that of Comparative Example 2 with respect to the hydrophilicity.

EXAMPLE 2

There was provided an apparatus shown in FIG. 2 wherein no material to be treated was placed in position and a metal wire alone having a diameter of 1 mm was provided as the counter electrode 7 and grounded. Helium gas was fed from the gas feed port 9 and filled up in the body. When an AC voltage with a frequency of 9 kHz was applied from the AC power source, an atmospheric pressure plasma was generated.

Then, a material 4 to be treated as used in Example 1 was placed as shown in FIG. 2. The material 4 was not grounded, under which helium gas was fed to and filled in the body and then, an AC voltage having a frequency of 9 kHz was applied to generate an atmospheric pressure plasma. The atmospheric pressure plasma was formed even in shaded portions A, B shown in FIG. 3, followed by hydrophilic treatment of the material 4 on the surface thereof. As a result, the material underwent a uniform and good hydrophilic treatment in the same manner as in Example 1.

As will be apparent from the foregoing description, according to the invention, an atmospheric pressure plasma can be generated within a hollow cylindrical electrode, so that an axially symmetric substrate in the form of a bar, a tube or a fiber can be uniformly, efficiently treated on the surface thereof. In addition, an elongated material can be readily surface treated in a continuous manner. Since the surface treatment is effected approximately at an atmospheric pressure, the surface treatment is applicable to substrates which contain relatively large amounts of moisture or plasticizers capable of readily generating gases. During the course of the surface treatment, little heat is generated, so that substrates made of low melting materials may be treated.

What is claimed is:

1. In a surface treating method which comprises applying a potential between electrodes spaced apart from each other in the presence of a gas at an atmospheric pressure thereby generating a plasma, and exposing a material to be treated to the thus generated plasma, the improvement comprising providing one of the electrodes in the form of a hollow cylinder and the other electrode in the shape of a bar or a tube, placing the other electrode within the one electrode in a spaced relation along an axial direction of the hollow cylinder so that the atmospheric pressure plasma is generated in the inside of the one electrode in the form of the hollow cylinder, and wherein the material to be treated has an axially symmetric shape and is placed in a zone where the plasma has been generated thereby to treat the surface of the material uniformly.

2. The surface treating method according to claim 1, wherein the potential is applied from an AC power supply and at least one of the electrodes is covered with an electrical insulator at a side which is in face-to-face relation with the other electrode.

3. The surface treating method according to claim 1, wherein the other electrode is placed on an axis of the hollow cylinder.

4. A surface treating apparatus wherein a potential is applied between electrodes spaced apart from each other in the presence of a selected gas at an atmospheric pressure thereby generating a plasma, and a material to be treated is exposed to the thus generated plasma, comprising:

an electrode in the form of a hollow cylinder, a counter electrode having a bar or tube shape placed in the inside of the hollow cylinder in a spaced relation with respect to the cylindrical electrode along an axial direction of the hollow cylinder, and a power supply for applying a potential between the cylindrical electrode and the counter electrode to generate an atmospheric pressure plasma, whereby a material to be treated which has an axially symmetric shape and is placed between the cylindrical electrode and the counter electrode is surface treated with the atmospheric pressure plasma uniformly.

5. The surface treating apparatus according to claim 4, wherein the material to be treated covers said counter electrode therewith.

6. The surface treating apparatus according to claim 4, wherein said hollow cylinder has an electrical insulator layer on the inner surface thereof.

* * * * *

UNITED STATES PATENT AND TRADEMARK OFFICE
CERTIFICATE OF CORRECTION

PATENT NO. : 5,225,659
DATED : July 6, 1993
INVENTOR(S) : Yukihiro Kusano et al.

It is certified that error appears in the above-indentified patent and that said Letters Patent is hereby corrected as shown below:

On the title page, Item [54] and column 1, Item [75] and [30],

The title should read: --METHOD AND APPARATUS FOR SURFACE TREATING AN AXIALLY SYMMETRIC SUBSTRATE AT ATMOSPHERIC PRESSURE--

The fourth and fifth inventor's information is entered incorrectly, should read: Satiko Okazaki, Tokyo; Masuhiro Kogoma, Wakou--.

The second Foreign Application Priority Data has been omitted, should read: --Mar. 24, 1992 [JP] Japan...............4-97072--

Signed and Sealed this

Seventeenth Day of May, 1994

*Attest:*

BRUCE LEHMAN

*Attesting Officer*　　*Commissioner of Patents and Trademarks*